(12) United States Patent
Goto et al.

(10) Patent No.: US 10,298,198 B2
(45) Date of Patent: May 21, 2019

(54) CRYSTAL VIBRATION ELEMENT AND CRYSTAL VIBRATION DEVICE

(71) Applicant: KYOCERA CRYSTAL DEVICE CORPORATION, Higashine-shi, Yamagata (JP)

(72) Inventors: Masahiko Goto, Higashine (JP); Kouhei Sasaoka, Higashine (JP)

(73) Assignee: KYOCERA CORPORATION, Kyoto-shi (JP)

( * ) Notice: Subject to any disclaimer, the term of this patent is extended or adjusted under 35 U.S.C. 154(b) by 301 days.

(21) Appl. No.: 15/232,150

(22) Filed: Aug. 9, 2016

(65) Prior Publication Data

US 2017/0250670 A1 Aug. 31, 2017

(30) Foreign Application Priority Data

Feb. 25, 2016 (JP) ................. 2016-033838

(51) Int. Cl.
*H03H 9/02* (2006.01)
*H03H 9/10* (2006.01)
*H03H 9/17* (2006.01)

(52) U.S. Cl.
CPC ...... *H03H 9/02157* (2013.01); *H03H 9/1021* (2013.01); *H03H 9/177* (2013.01); *H03B 2200/0018* (2013.01)

(58) Field of Classification Search
CPC ... H03H 9/02157; H03H 9/1021; H03H 9/177
USPC ........................................... 310/321
See application file for complete search history.

(56) References Cited

U.S. PATENT DOCUMENTS

2012/0056514 A1* 3/2012 Ishikawa ............ H03H 9/02157
310/344

FOREIGN PATENT DOCUMENTS

JP 2008-263387 A 10/2008

* cited by examiner

*Primary Examiner* — Derek J Rosenau
(74) *Attorney, Agent, or Firm* — Westerman, Hattori, Daniels & Adrian, LLP

(57) ABSTRACT

A vibration element includes a crystal blank, a pair of excitation electrodes, and pair of extraction electrodes. The crystal blank is an AT cut crystal blank including a mesa part and an outer circumferential part which is thinner than the mesa part and surrounds the mesa part. The pair of excitation electrodes is provided on the two major surfaces of the mesa part. The pair of extraction electrodes include pad parts which are provided at the end parts of the crystal blank in the longitudinal direction on one major surface of the outer circumferential part and are connected to the pair of excitation electrodes. The length in the longitudinal direction of the crystal blank is less than 1000 μm. When the resonance frequency is F (MHz) and t=1670/F, the distance "y" (μm) between each of the pad parts and the mesa part satisfies 0.048F+1.18<y/t<0.097F+0.36.

11 Claims, 14 Drawing Sheets

F=37.4MHz

| y/t \ Md/t | 10% | 14% | 15% | 18% | 20% |
|---|---|---|---|---|---|
| 1.79 | 66 | 165 | 115 | 114 | 144 |
| 2.02 | 59 | 144 | 82 | 101 | 130 |
| 2.24 | 54 | 125 | 74 | 92 | 115 |
| 2.46 | 51 | 105 | 64 | 83 | 92 |
| 2.69 | 47 | 81 | 60 | 73 | 82 |
| 2.91 | 44 | 65 | 52 | 55 | 70 |
| 3.14 | 46 | 47 | 49 | 47 | 55 |
| 3.36 | 55 | 48 | 45 | 49 | 53 |
| 3.58 | 60 | 45 | 48 | 48 | 52 |
| 3.81 | 65 | 46 | 47 | 46 | 51 |
| 4.03 | 70 | 55 | 49 | 48 | 52 |
| 4.26 | 75 | 65 | 50 | 54 | 55 |
| 4.48 | 80 | 75 | 70 | 57 | 60 |
| 4.70 | 91 | 89 | 88 | 59 | 64 |
| 4.93 | 102 | 101 | 100 | 64 | 66 |
| 5.15 | 110 | 118 | 115 | 69 | 68 |
| 5.37 | 122 |  | 140 | 73 | 70 |
| 5.60 | 134 |  | 157 | 80 | 72 |
| 5.82 | 145 |  | 182 | 91 | 77 |
| 6.05 | 155 |  | 205 | 103 | 90 |
| 6.27 | 160 |  | 220 | 114 | 100 |
| 6.49 | 170 |  | 241 | 122 | 120 |
| 6.72 | 180 |  |  | 130 |  |
| 6.94 | 190 |  |  | 144 |  |

(UNIT: Ω)

FIG.9

F=37.4MHz, Md=20%

| Ci(Ω) | Ci<100 | y/t | 3<y/t<4 | y/Md | 15<y/Md<30 | y/r | 3<y/r<5.5 |
|---|---|---|---|---|---|---|---|
| 144 | × | 1.79 | × | 8.96 | × | 1.79 | × |
| 130 | × | 2.02 | × | 10.08 | × | 2.01 | × |
| 115 | × | 2.24 | × | 11.20 | × | 2.24 | × |
| 92 | ○ | 2.46 | × | 12.32 | × | 2.46 | × |
| 82 | ○ | 2.69 | × | 13.44 | × | 2.68 | × |
| 70 | ○ | 2.91 | × | 14.56 | × | 2.91 | × |
| 55 | ○ | 3.14 | ○ | 15.68 | ○ | 3.13 | ○ |
| 53 | ○ | 3.36 | ○ | 16.80 | ○ | 3.35 | ○ |
| 52 | ○ | 3.58 | ○ | 17.92 | ○ | 3.58 | ○ |
| 51 | ○ | 3.81 | ○ | 19.04 | ○ | 3.80 | ○ |
| 52 | ○ | 4.03 | × | 20.16 | ○ | 4.02 | ○ |
| 55 | ○ | 4.26 | × | 21.28 | ○ | 4.25 | ○ |
| 60 | ○ | 4.48 | × | 22.40 | ○ | 4.47 | ○ |
| 64 | ○ | 4.70 | × | 23.51 | ○ | 4.70 | ○ |
| 66 | ○ | 4.93 | × | 24.63 | ○ | 4.92 | ○ |
| 68 | ○ | 5.15 | × | 25.75 | ○ | 5.14 | ○ |
| 70 | ○ | 5.37 | × | 26.87 | ○ | 5.37 | ○ |
| 72 | ○ | 5.60 | × | 27.99 | ○ | 5.59 | × |
| 77 | ○ | 5.82 | × | 29.11 | ○ | 5.81 | × |
| 90 | ○ | 6.05 | × | 30.23 | × | 6.04 | × |
| 100 | × | 6.27 | × | 31.35 | × | 6.26 | × |
| 120 | × | 6.49 | × | 32.47 | × | 6.48 | × |

FIG.10

F=37.4MHz, Md=18%

| Cl(Ω) | Cl<100 | y/t | 3<y/t<4 | y/Md | 15<y/Md<30 | y/r | 3<y/r<5.5 |
|---|---|---|---|---|---|---|---|
| 114 | × | 1.79 | × | 9.95 | × | 1.89 | × |
| 101 | × | 2.02 | × | 11.20 | × | 2.12 | × |
| 92 | ○ | 2.24 | × | 12.44 | × | 2.36 | × |
| 83 | ○ | 2.46 | × | 13.69 | × | 2.59 | × |
| 73 | ○ | 2.69 | × | 14.93 | × | 2.83 | × |
| 55 | ○ | 2.91 | × | 16.17 | ○ | 3.06 | ○ |
| 47 | ○ | 3.14 | ○ | 17.42 | ○ | 3.30 | ○ |
| 49 | ○ | 3.36 | ○ | 18.66 | ○ | 3.54 | ○ |
| 48 | ○ | 3.58 | ○ | 19.91 | ○ | 3.77 | ○ |
| 46 | ○ | 3.81 | ○ | 21.15 | ○ | 4.01 | ○ |
| 48 | ○ | 4.03 | × | 22.40 | ○ | 4.24 | ○ |
| 54 | ○ | 4.26 | × | 23.64 | ○ | 4.48 | ○ |
| 57 | ○ | 4.48 | × | 24.88 | ○ | 4.71 | ○ |
| 59 | ○ | 4.70 | × | 26.13 | ○ | 4.95 | ○ |
| 64 | ○ | 4.93 | × | 27.37 | ○ | 5.19 | ○ |
| 69 | ○ | 5.15 | × | 28.62 | ○ | 5.42 | ○ |
| 73 | ○ | 5.37 | × | 29.86 | ○ | 5.66 | × |
| 80 | ○ | 5.60 | × | 31.10 | × | 5.89 | × |
| 91 | ○ | 5.82 | × | 32.35 | × | 6.13 | × |
| 103 | × | 6.05 | × | 33.59 | × | 6.36 | × |
| 114 | × | 6.27 | × | 34.84 | × | 6.60 | × |
| 122 | × | 6.49 | × | 36.08 | × | 6.84 | × |
| 130 | × | 6.72 | × | 37.33 | × | 7.07 | × |
| 144 | × | 6.94 | × | 38.57 | × | 7.31 | × |

FIG.11

F=37.4MHz, Md=15%

| Cl(Ω) | Cl<100 | y/t | 3<y/t<4 | y/Md | 15<y/Md<30 | y/r | 3<y/r<5.5 |
|---|---|---|---|---|---|---|---|
| 115 | × | 1.79 | × | 11.94 | × | 2.07 | × |
| 82 | ○ | 2.02 | × | 13.44 | × | 2.32 | × |
| 74 | ○ | 2.24 | × | 14.93 | × | 2.58 | × |
| 64 | ○ | 2.46 | × | 16.42 | ○ | 2.84 | × |
| 60 | ○ | 2.69 | × | 17.92 | ○ | 3.10 | ○ |
| 52 | ○ | 2.91 | × | 19.41 | ○ | 3.36 | ○ |
| 49 | ○ | 3.14 | ○ | 20.90 | ○ | 3.61 | ○ |
| 45 | ○ | 3.36 | ○ | 22.40 | ○ | 3.87 | ○ |
| 48 | ○ | 3.58 | ○ | 23.89 | ○ | 4.13 | ○ |
| 47 | ○ | 3.81 | ○ | 25.38 | ○ | 4.39 | ○ |
| 49 | ○ | 4.03 | × | 26.87 | ○ | 4.65 | ○ |
| 50 | ○ | 4.26 | × | 28.37 | ○ | 4.91 | ○ |
| 70 | ○ | 4.48 | × | 29.86 | ○ | 5.16 | ○ |
| 88 | ○ | 4.70 | × | 31.35 | × | 5.42 | ○ |
| 100 | × | 4.93 | × | 32.85 | × | 5.68 | × |
| 115 | × | 5.15 | × | 34.34 | × | 5.94 | × |
| 140 | × | 5.37 | × | 35.83 | × | 6.20 | × |
| 157 | × | 5.60 | × | 37.33 | × | 6.45 | × |
| 182 | × | 5.82 | × | 38.82 | × | 6.71 | × |
| 205 | × | 6.05 | × | 40.31 | × | 6.97 | × |
| 220 | × | 6.27 | × | 41.80 | × | 7.23 | × |
| 241 | × | 6.49 | × | 43.30 | × | 7.49 | × |

FIG.12

F=37.4MHz, Md=14%

| CI(Ω) | CI<100 | y/t | 3<y/t<4 | y/Md | 15<y/Md<30 | y/r | 3<y/r<5.5 |
|---|---|---|---|---|---|---|---|
| 165 | × | 1.79 | × | 12.80 | × | 2.14 | × |
| 144 | × | 2.02 | × | 14.40 | × | 2.41 | × |
| 125 | × | 2.24 | × | 16.00 | ○ | 2.67 | × |
| 105 | × | 2.46 | × | 17.60 | ○ | 2.94 | × |
| 81 | ○ | 2.69 | × | 19.20 | ○ | 3.21 | ○ |
| 65 | ○ | 2.91 | × | 20.80 | ○ | 3.47 | ○ |
| 47 | ○ | 3.14 | ○ | 22.40 | ○ | 3.74 | ○ |
| 48 | ○ | 3.36 | ○ | 23.99 | ○ | 4.01 | ○ |
| 45 | ○ | 3.58 | ○ | 25.59 | ○ | 4.28 | ○ |
| 46 | ○ | 3.81 | ○ | 27.19 | ○ | 4.54 | ○ |
| 55 | ○ | 4.03 | × | 28.79 | ○ | 4.81 | ○ |
| 65 | ○ | 4.26 | × | 30.39 | × | 5.08 | ○ |
| 75 | ○ | 4.48 | × | 31.99 | × | 5.35 | ○ |
| 89 | ○ | 4.70 | × | 33.59 | × | 5.61 | × |
| 101 | × | 4.93 | × | 35.19 | × | 5.88 | × |
| 118 | × | 5.15 | × | 36.79 | × | 6.15 | × |

FIG.13

F=37.4MHz, Md=10%

| CI(Ω) | CI<100 | y/t | 3<y/t<4 | y/Md | 15<y/Md<30 | y/r | 3<y/r<5.5 |
|---|---|---|---|---|---|---|---|
| 66 | ○ | 1.79 | × | 17.92 | ○ | 2.53 | × |
| 59 | ○ | 2.02 | × | 20.16 | ○ | 2.85 | × |
| 54 | ○ | 2.24 | × | 22.40 | ○ | 3.16 | ○ |
| 51 | ○ | 2.46 | × | 24.63 | ○ | 3.48 | ○ |
| 47 | ○ | 2.69 | × | 26.87 | ○ | 3.79 | ○ |
| 44 | ○ | 2.91 | × | 29.11 | ○ | 4.11 | ○ |
| 46 | ○ | 3.14 | ○ | 31.35 | × | 4.43 | ○ |
| 55 | ○ | 3.36 | ○ | 33.59 | × | 4.74 | ○ |
| 60 | ○ | 3.58 | ○ | 35.83 | × | 5.06 | ○ |
| 65 | ○ | 3.81 | ○ | 38.07 | × | 5.38 | ○ |
| 70 | ○ | 4.03 | × | 40.31 | × | 5.69 | × |
| 75 | ○ | 4.26 | × | 42.55 | × | 6.01 | × |
| 80 | ○ | 4.48 | × | 44.79 | × | 6.32 | × |
| 91 | ○ | 4.70 | × | 47.03 | × | 6.64 | × |
| 102 | × | 4.93 | × | 49.27 | × | 6.96 | × |
| 110 | × | 5.15 | × | 51.51 | × | 7.27 | × |
| 122 | × | 5.37 | × | 53.75 | × | 7.59 | × |
| 134 | × | 5.60 | × | 55.99 | × | 7.91 | × |
| 145 | × | 5.82 | × | 58.23 | × | 8.22 | × |
| 155 | × | 6.05 | × | 60.47 | × | 8.54 | × |
| 160 | × | 6.27 | × | 62.71 | × | 8.85 | × |
| 170 | × | 6.49 | × | 64.95 | × | 9.17 | × |
| 180 | × | 6.72 | × | 67.19 | × | 9.49 | × |
| 190 | × | 6.94 | × | 69.43 | × | 9.80 | × |

FIG.14

F=27.12MHz, Md=20%

| CI(Ω) | CI<100 | y/t | 2.5<y/t<3 | y/Md | 12.5<y/Md<22.2 | y/r | 3<y/r<5.5 |
|---|---|---|---|---|---|---|---|
| 110 | × | 1.95 | × | 9.74 | × | 2.68 | × |
| 97 | ○ | 2.11 | × | 10.56 | × | 2.91 | × |
| 84 | ○ | 2.27 | × | 11.37 | × | 3.13 | ○ |
| 75 | ○ | 2.44 | × | 12.18 | × | 3.35 | ○ |
| 65 | ○ | 2.60 | ○ | 12.99 | ○ | 3.58 | ○ |
| 66 | ○ | 2.76 | ○ | 13.80 | ○ | 3.80 | ○ |
| 64 | ○ | 2.92 | ○ | 14.62 | ○ | 4.02 | ○ |
| 67 | ○ | 3.09 | × | 15.43 | ○ | 4.25 | ○ |
| 77 | ○ | 3.25 | × | 16.24 | ○ | 4.47 | ○ |

CRYSTAL VIBRATION ELEMENT AND CRYSTAL VIBRATION DEVICE

TECHNICAL FIELD

The present invention relates to a crystal vibration element and to a crystal vibration device having this crystal vibration element. The crystal vibration device is for example a crystal unit or crystal oscillator.

BACKGROUND ART

Known in the art is a crystal vibration element comprised of an AT cut blank of crystal on the two major surfaces (the widest surfaces (the front and back) of a plate shaped member) of which a pair of excitation electrodes are provided (for example Patent Literature 1). Such a crystal vibration element has a pair of extraction electrodes for mounting this crystal vibration element on an element mount member. A pair of extraction electrodes for example has a pair of pad parts at the end parts of the crystal blank in the longitudinal direction. Further, by an arrangement of the pad parts so as to face the pads of the element mount member and joining of the two by bumps (made of for example a conductive adhesive), the crystal vibration element is supported in a cantilever fashion. As a result, the crystal vibration element can vibrate in most of its length except the end parts in the longitudinal direction.

Further, as the crystal vibration element described above, there is also known a so-called mesa-structure (for example Patent Literature 1). In a mesa type crystal vibration element, the crystal blank has a mesa part provided with a pair of excitation electrodes and has an outer circumferential part which is positioned at the periphery of the mesa part and is thinner than the mesa part. The pad parts of the pair of extraction electrodes are provided in the outer circumferential part. In a mesa type crystal vibration element, it is easy to enclose energy in the mesa part. Therefore, for example, the influence of the joints of the extraction electrodes upon the vibration characteristics is reduced.

Patent Literature 1 proposes that the length Sx (mm) of the pad parts in the longitudinal direction of the crystal vibration element be made smaller than dx−0.05 where the distance from the outer edge of the outer circumferential part to the outer edge of the mesa part (inner edge of the outer circumferential part) is dx (mm). Although the proposal relates to the size of the pad part the proposal suggests to make the distance between a pad part and the mesa part 50 µm or more.

CITATION LIST

Patent Literature

Patent Literature 1: Japanese Patent Publication No. 2008-263387A

SUMMARY OF INVENTION

Technical Problem

In recent years, the demand for reduction of the size of crystal vibration elements has become higher. However, when a crystal vibration element is reduced in size, its crystal impedance (CI) tends to become larger. Accordingly, it is desired to provide a crystal vibration element which is reduced in size and has a small CI and a crystal vibration device having this crystal vibration element.

Solution to Problem

A crystal vibration element according to one aspect of the present invention includes an AT cut crystal blank including a mesa part and an outer circumferential part which is thinner than the mesa part and surrounds the mesa part, a pair of excitation electrodes provided on the two major surfaces of the mesa part, and a pair of extraction electrodes including pad parts provided at the end parts of the crystal blank in the longitudinal direction on one major surface of the outer circumferential part and connected to the pair of excitation electrodes The length in the longitudinal direction of the crystal blank is less than 1000 µm. The resonance frequency F=37.4 MHz. When t=1670/F, the distance "y" (µm) between the pad part and the mesa part satisfies $3.0<y/t<4.0$.

A crystal vibration element according to another aspect of the present invention includes an AT cut crystal blank including a mesa part and an outer circumferential part which is thinner than the mesa part and surrounds the mesa part, a pair of excitation electrodes provided on the two major surfaces of the mesa part, and a pair of extraction electrodes including pad parts provided at the end parts of the crystal blank in the longitudinal direction on one major surface of the outer circumferential part and connected to the pair of excitation electrodes. The length in the longitudinal direction of the crystal blank is less than 1000 µm. The resonance frequency F=27.12 MHz. When t=1670/F, the distance y (µm) between the pad part and the mesa part satisfies $2.5<y/t<3.0$.

A crystal vibration element according to another aspect of the present invention includes an AT cut crystal blank including a mesa part and an outer circumferential part which is thinner than the mesa part and surrounds the mesa part, a pair of excitation electrodes provided on the two major surfaces of the mesa part, and a pair of extraction electrodes including pad parts provided at the end parts of the crystal blank in the longitudinal direction on one major surface of the outer circumferential part and connected to the pair of excitation electrodes. The length in the longitudinal direction of the crystal blank is less than 1000 µm. When the resonance frequency is F (MHz) and t=1670/F, the distance "y" (µm) between the pad part and the mesa part satisfies $0.048F+1.18<y/t<0.097F+0.36$.

A crystal vibration element according to another aspect of the present invention includes an AT cut crystal blank including a mesa part and an outer circumferential part which is thinner than the mesa part and surrounds the mesa part, a pair of excitation electrodes provided on the two major surfaces of the mesa part, and a pair of extraction electrodes including pad parts provided at the end parts of the crystal blank in the longitudinal direction on one major surface of the outer circumferential part and connected to the pair of excitation electrodes. The length in the longitudinal direction of the crystal blank is less than 1000 µm. The resonance frequency F=37.4 MHz. When t=1670/F and a depth of the major surface of the outer circumferential part from the major surface of the mesa part is Md (µm), the distance y (µm) between the pad part and the mesa part satisfies $15<y/Md<30$.

A crystal vibration element according to another aspect of the present invention includes an AT cut crystal blank including a mesa part and an outer circumferential part which is thinner than the mesa part and surrounds the mesa part, a pair of excitation electrodes provided on the two major surfaces of the mesa part, and a pair of extraction electrodes including pad parts provided at the end parts of the crystal blank in the longitudinal direction on one major surface of the outer circumferential part and connected to the pair of excitation electrodes. The length in the longitudinal direction of the crystal blank is less than 1000 μm. When the resonance frequency is F (MHz), t=1670/F and the depth of the major surface of the outer circumferential part from the major surface of the mesa part is Md (μm), the distance "y" (μm) between the pad part and the mesa part satisfies 15×(0.048F+1.18)/3.0<y/Md<30×(0.097F+0.36)/4.0.

A crystal vibration element according to an aspect of the present invention includes an AT cut crystal blank including a mesa part and an outer circumferential part which is thinner than the mesa part and surrounds the mesa part, a pair of excitation electrodes provided on the two major surfaces of the mesa part, and a pair of extraction electrodes including pad parts provided at the end parts of the crystal blank in the longitudinal direction on one major surface of the outer circumferential part and connected to the pair of excitation electrodes. The length in the longitudinal direction of the crystal blank is less than 1000 μm. When the resonance frequency is F (MHz), t=1670/F and the depth of the major surface of the outer circumferential part from the major surface of the mesa part is Md (μm), the distance y (μm) between the pad part and the mesa part satisfies $3.0 < y/(\sqrt{(Md/t)} \times 100) < 5.5$.

A crystal vibration device according to another aspect of the present invention includes a crystal vibration element, an element mount member, and a bump joining the crystal vibration element and the element mount member. The crystal vibration element includes an AT cut crystal blank including a mesa part and an outer circumferential part which is thinner than the mesa part and surrounds the mesa part and includes a pair of excitation electrodes provided on the two major surfaces of the mesa part. The bump joins an end part of the crystal blank in the longitudinal direction on one major surface of the outer circumferential part and the element mount member. The length in the longitudinal direction of the crystal blank is less than 1000 μm. The resonance frequency F=37.4 MHz. When t=1670/F, a distance LMB (μm) between the joined range of the bump with respect to the crystal vibration element and the mesa part satisfies 3.0<LMB/t<4.0.

A crystal vibration device according to another aspect of the present invention includes a crystal vibration element, an element mount member, and a bump joining the crystal vibration element and the element mount member. The crystal vibration element includes an AT cut crystal blank including a mesa part and an outer circumferential part which is thinner than the mesa part and surrounds the mesa part and includes a pair of excitation electrodes provided on the two major surfaces of the mesa part. The bump joins an end part of the crystal blank in the longitudinal direction on one major surface of the outer circumferential part and the element mount member. The length in the longitudinal direction of the crystal blank is less than 1000 μm. The resonance frequency F=27.12 MHz. When t=1670/F, a distance LMB (μm) between the joined range of the bump with respect to the crystal vibration element and the mesa part satisfies 2.5<LMB/t<3.0.

A crystal vibration device according to another aspect of the present invention includes a crystal vibration element, an element mount member, and a bump joining the crystal vibration element and the element mount member. The crystal vibration element includes an AT cut crystal blank including a mesa part and an outer circumferential part which is thinner than the mesa part and surrounds the mesa part and includes a pair of excitation electrodes provided on the two major surfaces of the mesa part. The bump joins an end part of the crystal blank in the longitudinal direction on one major surface of the outer circumferential part and the element mount member. The length in the longitudinal direction of the crystal blank is less than 1000 μm. When the resonance frequency is F (MHz) and t=1670/F, a distance LMB (μm) between the joined range of the bump with respect to the crystal vibration element and the mesa part satisfies 0.048F+1.18<LMB/t<0.097F+0.36.

A crystal vibration device according to another aspect of the present invention includes a crystal vibration element, an element mount member, and a bump joining the crystal vibration element and the element mount member. The crystal vibration element includes an AT cut crystal blank including a mesa part and an outer circumferential part which is thinner than the mesa part and surrounds the mesa part and includes a pair of excitation electrodes provided on the two major surfaces of the mesa part. The bump joins an end part of the crystal blank in the longitudinal direction on one major surface of the outer circumferential part and the element mount member. The length in the longitudinal direction of the crystal blank is less than 1000 μm. The resonance frequency F=37.4 MHz. When t=1670/F and the depth of the major surface of the outer circumferential part from the major surface of the mesa part is Md (μm), the distance LMB (μm) between the joined range of the bump with respect to the crystal vibration element and the mesa part satisfies 15<LMB/Md<30.

Advantageous Effects of Invention

According to the above configurations, crystal vibration elements and crystal vibration devices which are reduced in size and have small crystal impedances can be realized.

BRIEF DESCRIPTION OF DRAWINGS

FIG. 9 A chart showing a preferred range of "y" in a case where F=37.4 MHz and Md/t×100=20%

FIG. 10 A chart showing a preferred range of "y" in a case where F=37.4 MHz and Md/t×100=18%

FIG. 11 A chart showing a preferred range of "y" in a case where F=37.4 MHz and Md/t×100=15%

FIG. 12 A chart showing a preferred range of "y" in a case where F=37.4 MHz and Md/t×100=14%

FIG. 13 A chart showing a preferred range of "y" in a case where F=37.4 MHz and Md/t×100=10%

FIG. 14 A chart showing a preferred range of "y" in a case where F=27.12 MHz, and Md/t×100=20%

DESCRIPTION OF EMBODIMENTS

Figure 1:
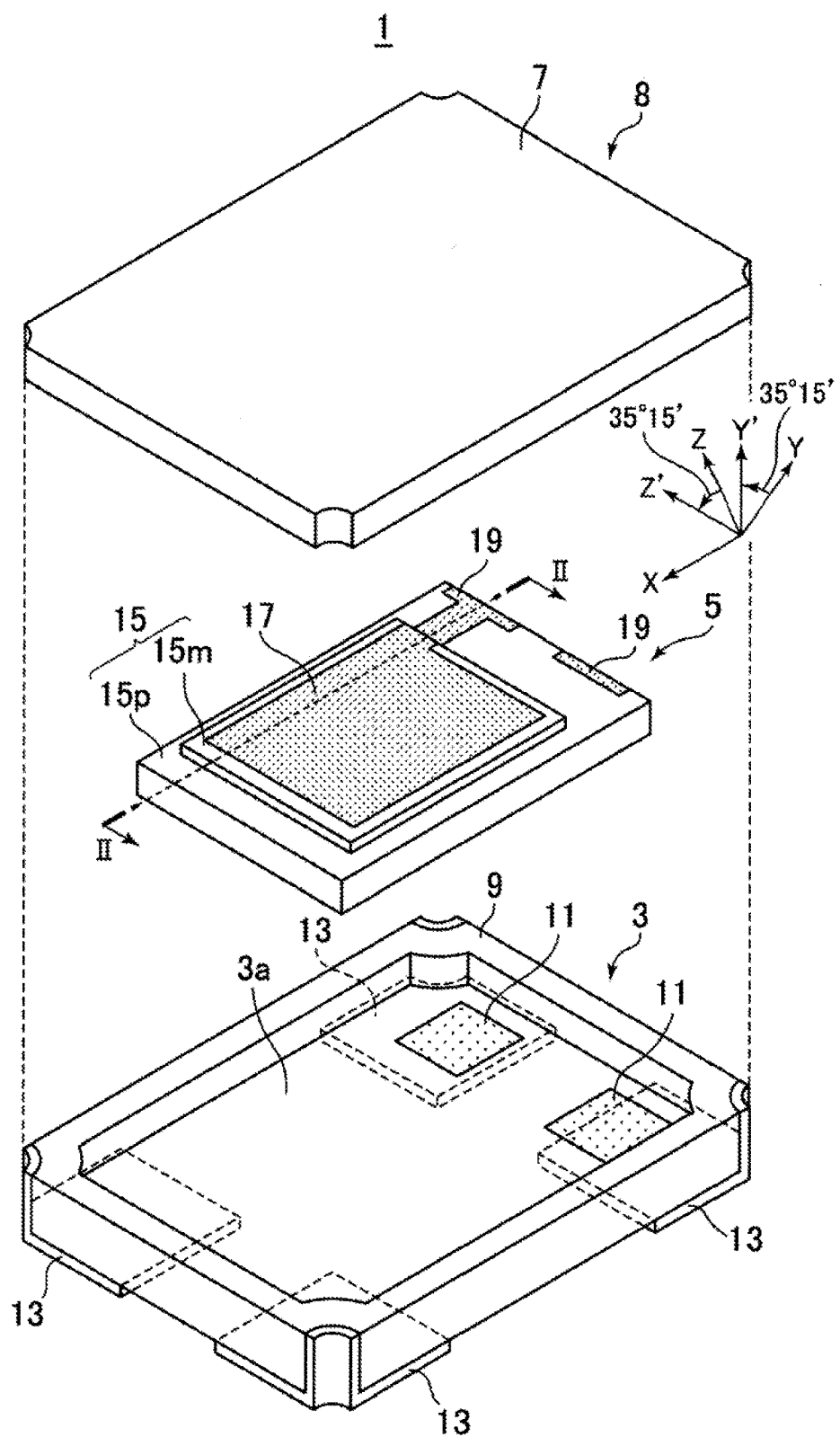
FIG. 1 A disassembled perspective view substantially showing the configuration of a crystal unit according to an embodiment of the present invention.

Below, embodiments of the present invention will be explained with reference to the drawings. Note that, the drawings used in the following explanation are schematic ones. Dimensions, ratios, etc. in the drawings do not always coincide with the actual ones. Further, for convenience, hatching will be sometimes added to the surfaces of the layered members (that is, surfaces which are not cross-sections).

(Schematic Configuration of Crystal Unit)

Figure 2:
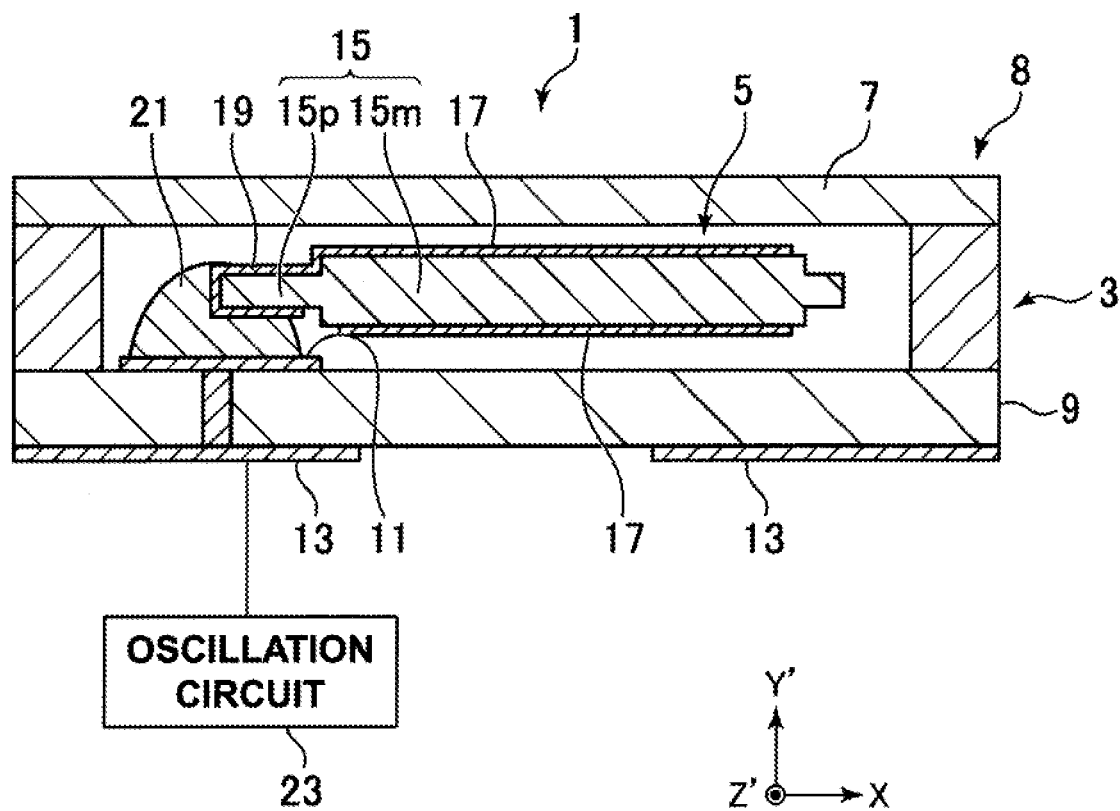
FIG. 2 is a cross-sectional view taken along a line II-II in the crystal unit in FIG. 1.

FIG. 1 is a disassembled perspective view showing a schematic configuration of a crystal unit 1 according to an embodiment of the present invention. Further, FIG. 2 is a cross-sectional view taken along the line II-II in FIG. 1.

The crystal unit 1 is for example an electronic part made a substantially thin box shape. The dimensions thereof may be suitably set. For example, in a relatively small one, the length of a long side or short side is 1 to 2 mm, and the thickness is 0.2 to 0.4 mm.

The crystal unit 1 for example has an element mount member 3 having a concave portion 3a formed therein, a crystal vibration element 5 (below, "crystal" will be sometimes omitted.) held in the concave portion 3a, and a lid member 7 which closes the concave portion 3a.

The element mount member 3 and lid member 7 configure a package 8 for packaging the vibration element 5. The concave portion 3a of the element mount member 3 is sealed by the lid member 7, and the internal portion thereof is for example evacuated or a suitable gas (for example nitrogen) is enclosed.

The element mount member 3 for example has a base 9 which becomes a main constituent of the element mount member 3, element mounting pads 11 for mounting the vibration element 5, and external terminal 13 for mounting the crystal unit 1 on a not shown circuit board or the like.

The base 9 is made of insulating material such as ceramic and configures the concave portion 3a described above. The element mounting pads 11 and external terminals 13 are for example configured by conductive layers made of metal or the like and are connected to each other by conductors (FIG. 2. Notation is omitted.) arranged in the base 9. The lid member 7 is configured by for example metal and is joined to the upper surface of the element mount member 3 by seam welding or the like.

The vibration element 5 for example has a crystal blank 15, a pair of excitation electrodes 17 for applying voltage to the crystal blank 15, and a pair of extraction electrodes 19 for mounting the vibration element 5 on the element mounting pads 11.

The crystal blank 15 is a so-called AT cut crystal blank. That is, as shown in FIG. 1, in the crystal, when defining an orthogonal coordinate system XY'Z' which is obtained by rotating an orthogonal coordinate system XYZ comprised of an X-axis (electrical axis), Y-axis (mechanical axis), and Z-axis (optical axis) by 30° or more and 40° or less (35°15' as an example) around the X-axis, the crystal blank 15 is a plate shape which is cut parallel to the XZ' plane.

Figure 4A:
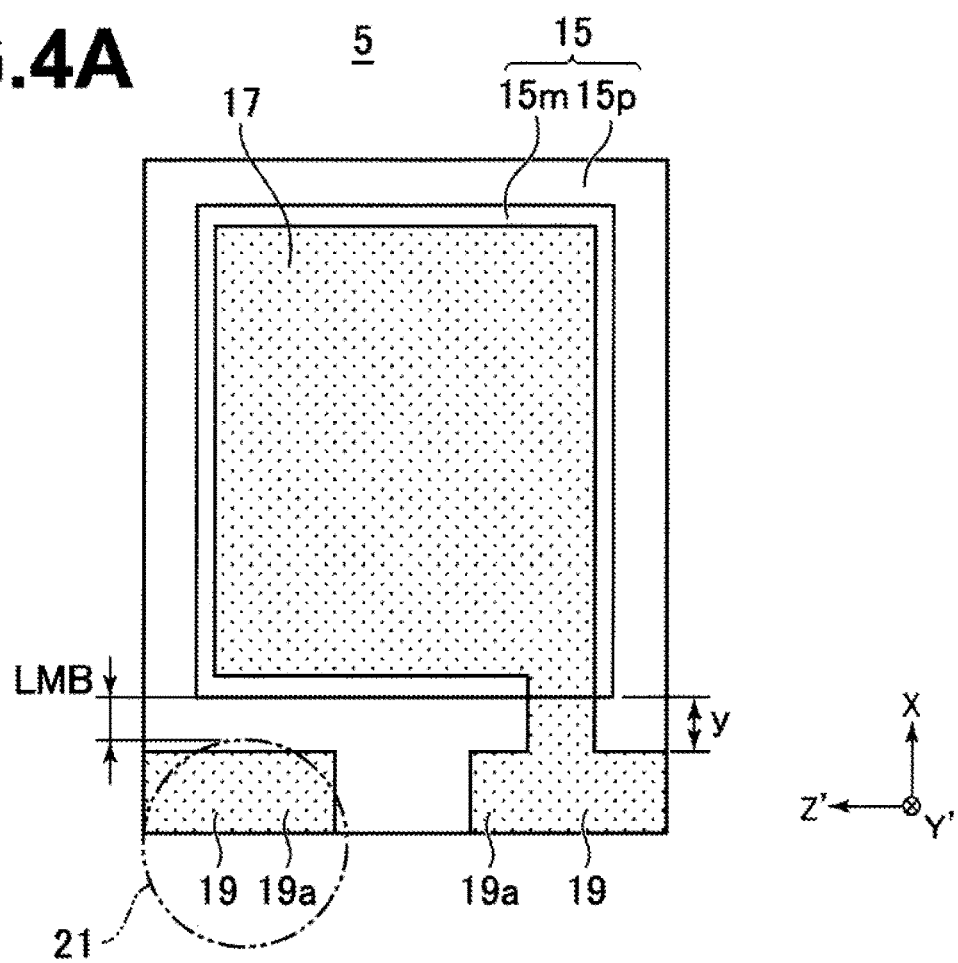
FIG. 4A is a bottom view showing the crystal vibration element in FIG. 3.

The pair of excitation electrodes 17 and pair of extraction electrodes 19 are configured by conductive layers made of metal or the like. The pair of excitation electrodes 17 is for example provided on the center sides of the two major surfaces of the crystal blank 15. The pair of extraction electrodes 19 for example extend from the pair of excitation electrodes 17 toward one side of the X-axis direction (may be either positive or negative) and has a pair of pad parts 19a on one end of the crystal blank 15 (FIG. 4A).

The vibration element 5 is accommodated in the concave portion 3a while making its major surface face the bottom surface of the concave portion 3a. The pad parts 19a of the extraction electrodes 19 are joined to the element mounting pads 11 by bumps 21 (FIG. 2). Due to this, the vibration element 5 is supported upon the element mount member 3 in a cantilever manner. Further, the pair of excitation electrodes 17 are electrically connected to the pair of element mounting pads 11 and consequently are electrically connected to any two among a plurality of external terminals 13. The bumps 21 are for example made of a conductive adhesive. The conductive adhesive is for example comprised by mixing a conductive filler in a thermosetting resin.

The crystal unit 1 configured in this way is for example arranged so as to make the lower surface of the element mount member 3 face to the mount surface of a not shown circuit board, and is mounted on the circuit board by joining the external terminals 13 to the pads of the circuit board by solder or the like. On the circuit board, for example an oscillation circuit 23 (FIG. 2) is configured. The oscillation circuit 23 applies AC voltage through the external terminals 13 and element mounting pads 11 to the pair of excitation electrodes 17 to generate an oscillation signal. At this time, the oscillation circuit 23 for example utilizes a fundamental-wave oscillation in thickness-shear vibration of the crystal blank 15.

(Shape of Crystal Vibration Element)

Figure 3:
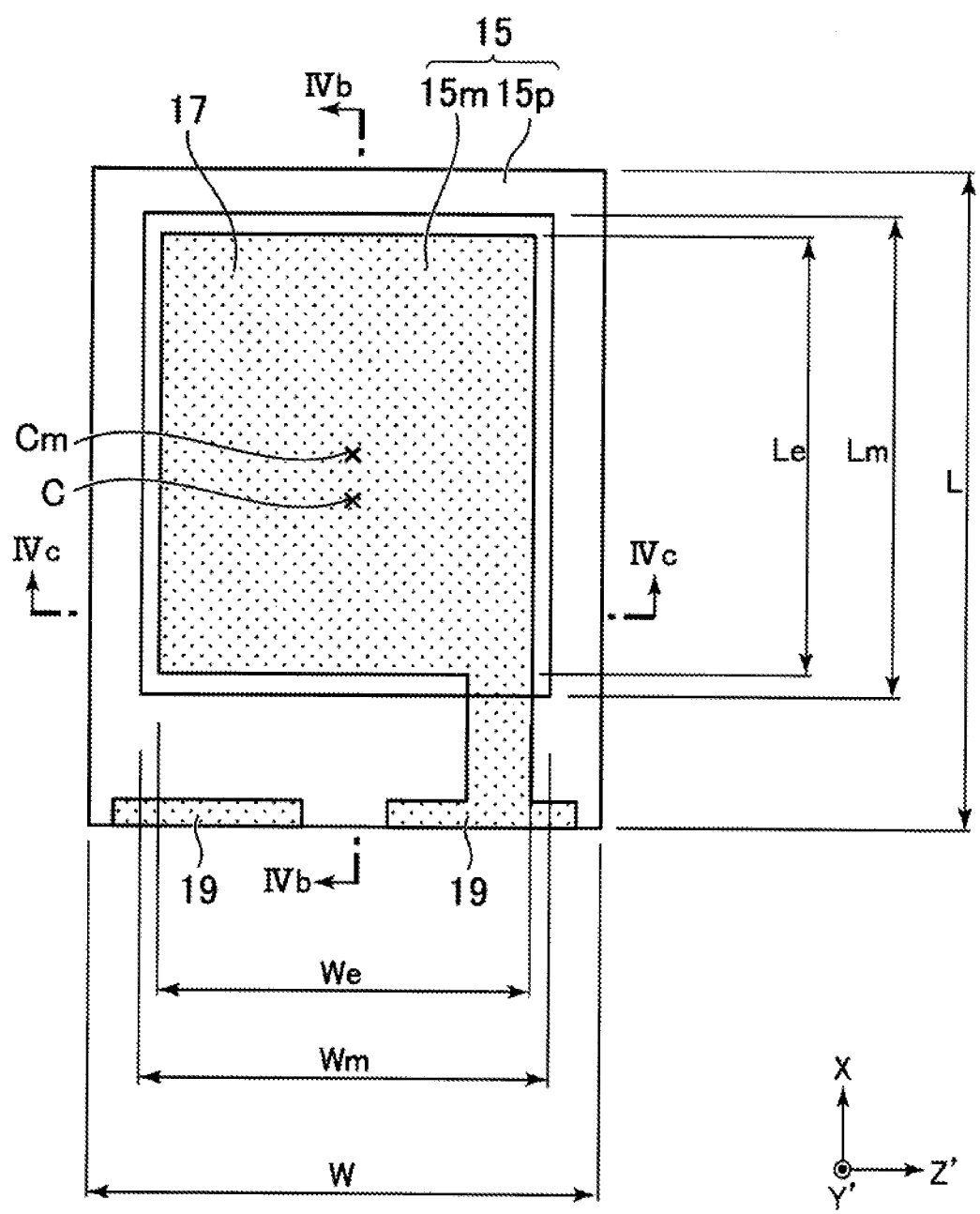
FIG. 3 A top view showing a crystal vibration element in the crystal unit in FIG. 1.
Figure 4B:
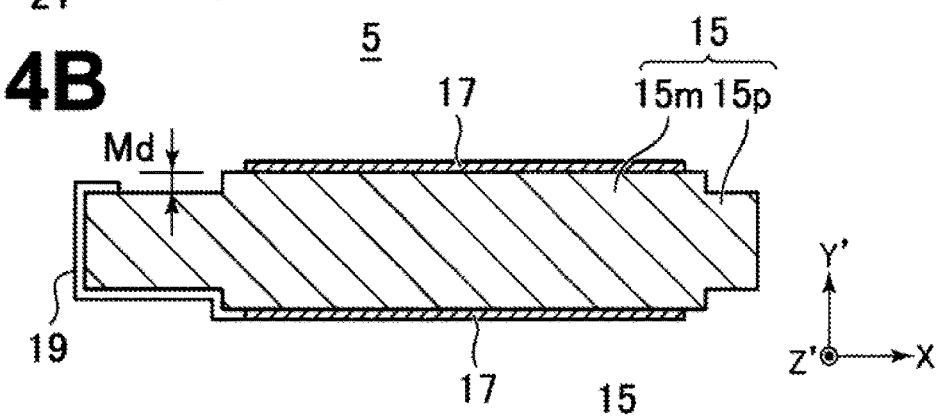
FIG. 4B is a cross-sectional view taken along the line IVb-IVb in FIG. 3.
Figure 4C:
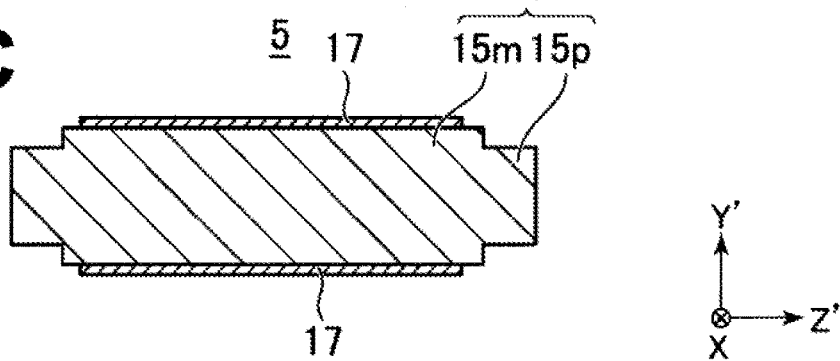
FIG. 4C is a cross-sectional view taken along the line IVc-IVc in FIG. 3.

FIG. 3 is a top view showing the vibration element 5. FIG. 4A is a bottom view showing the vibration element 5. FIG. 4B is a cross-sectional view taken along the line IVb-IVb in FIG. 3. FIG. 4C is a cross-sectional view taken along the line IVc-IVc in FIG. 3. Note that, in FIG. 4A, the XZ' cross-section of the bump 21 at the height of the lower surface of the vibration element 5 is indicated by a dotted line.

The crystal blank 15 is for example a so-called mesa type. That is, the crystal blank 15 has a mesa part 15m and an outer circumferential part 15p which surrounds the periphery of the mesa part 15m and is thinner than the mesa part 15m. By such a shape, an energy enclosing effect can be improved, and consequently the crystal impedance (CI, an equivalent series resistance when there is no load capacity) can be lowered.

The mesa part 15m is for example made a thin box shape having a pair of major surfaces parallel to XZ'. Its major surface is a rectangle having long sides parallel to the X-axis and short sides parallel to the Z'-axis. The outer circumferential part 15p is for example made a thin box shape so as to have a pair of major surfaces parallel to XZ' if the mesa part 15m is ignored. The shape of its outer edge is a rectangle having long sides parallel to the X-axis and short sides parallel to the Z'-axis. Note that, the crystal blank 15 defines the X-axis direction as the longitudinal direction in this way.

When viewed on a plane (FIG. 3 or FIG. 4A), the mesa part 15m is positioned at the center in the Z'-axis direction relative to the outer shape (outer edge) of the crystal blank 15 (outer circumferential part 15p) and is positioned in the X-axis direction while being deviated to the opposite side from the extraction electrodes 19. From another viewpoint, the center Cm of the mesa part 15m (FIG. 3) is deviated to the opposite side from the extraction electrodes 19 in the X-axis direction relative to the center C of the crystal blank 15 (FIG. 3). The centers C and Cm are centers of figures when viewed on a plane and are intersection points of a pair of diagonal lines in rectangles. In this way, by offsetting the mesa part 15m to the opposite side from the extraction electrode 19 side relative to the outer shape of the crystal blank 15, the influence due to the regulation of the vibration of the vibration element 5 by the bumps 21 can be reduced. Note that, in the present embodiment, the case where the center Cm of the mesa part 15m and the center C of the crystal blank 15 do not coincide is explained, but the center of the mesa part 15m and the center C of the crystal blank 15 may coincide as well.

When viewed by a cross-section (FIG. 4B or FIG. 4C), the crystal blank 15 is for example line symmetrically shaped in the vertical direction. That is, the outer circumferential part 15p is positioned at the center of the vertical direction with respect to the mesa part 15m.

A pair of major surfaces of the mesa part 15m is for example formed to planes parallel to the XZ' plane with a relatively high precision by performing polishing or the like. In another viewpoint, the thickness of the mesa part 15m is controlled to the constant and predetermined value with a relatively high precision. The pair of major surfaces of the outer circumferential part 15p, the outer peripheral surface of the mesa part 15m, and the outer peripheral surface of the outer circumferential part 15p are formed by for example etching.

Note that, needless to say the crystal blank 15 and other members may have machining error as well. In particular, in the crystal blank 15, a relatively large error may occur, and a shape which is a bit different from the shape explained above may be realized as well. This is because the crystal shows anisotropy with respect to etching, and an error is apt to occur. For example, the outer peripheral surfaces of the mesa part 15m and outer circumferential part 15p are basically planes parallel to the Y'-axis. However, they may have some inclination or roundness as well. Further, for example, the corner portions of the crystal blank 15 may have roundness as well.

The planar shape of the excitation electrode 17 is for example a rectangle having long sides parallel to the X-axis, and short sides parallel to the Z'-axis. The excitation electrodes 17 are for example contained in the major surfaces of the mesa part 15m. Further, the center thereof (center of figure) coincides with the major surface of the mesa part 15m (center of figure). Note that, in the present embodiment, the case where the center of the excitation electrode 17 and the center of the mesa part 15m coincide is explained, but the center of the excitation electrode 17 may be deviated to the side opposite to the extraction electrode 19 as well.

The extraction electrodes 19 have the pad parts 19a as explained above. Note that, in the present embodiment, the pad parts 19a are provided on only the lower surface of the crystal blank 15, but the pad parts 19a may be provided on both of the pair of major surfaces so that either of the pair of major surfaces (upper surface and lower surface) of the crystal blank 15 may be made to face the bottom surface of the concave portion 3a as well. For example, the pair of extraction electrodes 19 may be formed in a shape that is 180°-rotational symmetry relative to the center line (not shown) which passes through the center of the crystal blank 15, and is parallel to the X-axis.

The pad part 19a for example has a portion which is positioned in the end part of the longitudinal direction (X-axis direction) of the crystal blank 15 on at least the major surface (lower surface) of the outer circumferential part 15p. This portion positioned on the lower surface for example reaches the outer edge (short side) of the outer circumferential part 15p in the longitudinal direction of the crystal blank 15, while is spaced from the inner edge of the outer circumferential part 15p (outer edge of the mesa part 15m). Note that, this portion may reach the outer edge (long side) of the outer circumferential part 15p also in the short side direction of the crystal blank as in the illustrated example. The shape of this portion is for example a rectangle. Further, the pad part 19a may be formed so as to expand up to the end face on one side of the X-axis direction of the outer circumferential part 15p and up to the upper surface of the outer circumferential part 15p as in the illustrated example as well.

(Definition of Dimensions in Crystal Vibration Element)

In the explanation of the present embodiment, to the dimensions of the portions in the crystal vibration element, notations will be assigned as in the following way.

L: Length of crystal blank 15 (X-axis direction)
W: Width of crystal blank 15 (Z'-axis direction)
Lm: Length of mesa part 15m (X-axis direction)
Wm: Width of mesa part 15m (Z'-axis direction)
t: Thickness of mesa part 15m (converted score from resonance frequency, Y'-axis direction)
Le: Length of excitation electrode 17 (X-axis direction)
We: Width of excitation electrode 17 (Z'-axis direction)
Md: Depth from major surface of mesa part 15m up to major surface of outer circumferential part 15p
y: Distance from pad part 19a to mesa part 15m
LMB: Distance between junction region of bump 21 with respect to crystal vibration element 5 and mesa part 15m The thickness "t" is not an actual thickness of the mesa part 15m (hereinafter, defined as t'), but is converted from the resonance frequency F here. That is, $t(\mu m) = 1670/F$ (MHz). The actual thickness t' becomes a value obtained by suitable adjustment from the thickness "t" in accordance with the film thickness etc. of the excitation electrode 17 considering the influence of the weight etc. of the excitation electrode 17 exerted upon the resonance frequency F. The film thickness etc. of the excitation electrode 17 are suitably set based on experiences etc. of each manufacturer. Accordingly, the converted thickness "t" is more suitable than the actual thickness t' when checking the general or widespread influence of the dimension exerted upon the characteristics of the vibration element 5.

The resonance frequency F referred to here is the resonance frequency of the vibration element 5 itself and does not include the influences by the stray capacitance of the package 8, the load capacity of the oscillation circuit 23, and so on. When judging whether an actual product corresponds to the invention of the present application, the resonance frequency may be specified for example by measurement of the product or may be specified according to s value shown in the specification etc. Further, the resonance frequency F is basically one of fundamental-wave oscillation according to thickness-shear. However, strictly speaking, it is influenced by another vibration mode.

The distances y and LMB are distances on the side facing the element mounting pads 11 (negative side of the Y'-axis direction in the illustrated example). The crystal blank 15 is vertically symmetric as explained above, and the depths Md are the same between the upper and lower surfaces. It is considered that the outer edge of the junction region on the mesa part 15m side of the bump 21 with respect to the vibration element 5 (see the dotted line in FIG. 4A) does not become parallel to the outer edge of the mesa part 15m. In such case, so far as a unique shape such as convex portion is not formed in the junction region, the distance LMB may be regarded as the shortest distance between the junction region and the mesa part 15m. This is because the influence of joining exerted upon the vibration which will be explained later is acted by the shortest distance. Note, when a convex portion or the like exists, a mean distance of the junction region for the outer edge on the mesa part 15m side may be used as well. This is true also for the distance "y".

EXAMPLES

The inventors of the present application paid attention to the fact that the cause of increase of CI when reducing the size of a vibration element 5 is that the distance between the bump 21 and the mesa part 15m becomes short and the influence due to the vibration element 5 being fastened on the element mount member 3 exerted upon the vibration becomes larger. Further, they prepared a plurality of samples (vibration elements 5) making the distance "y" or LMB (hereinafter, sometimes LMB will be omitted and only "y" will be shown) and the dimension of depth Md different from each other and performed experiments for checking the CI of them. As a result, it was seen that a preferred range of the distance "y" existed concerning a reduction of CI in a case where the length L of the crystal blank 15 was limited to a relatively small dimension (for example less than 1000 μm). Specifically, this is as follows.

Dimensions of Examples

As the resonance frequencies F of the samples, the following two types of 37.4 MHz and 27.12 MHz were determined. The dimensions of the samples concerned with the resonance frequencies were as follows.

(Dimensions of Samples Where F=37.4 MHz)
L: 590 μm to 790 μm (for example 690 μm)
W: 440 μm to 640 μm (for example 540 μm)
Lm: 300 μm to 590 μm (for example 490 μm)
Wm: 325 μm to 525 μm (for example 425 μm)
Le: 340 μm to 540 μm (for example 440 μm)
We: 295 μm to 495 μm (for example 395 μm)
t: 1670/37.4=about 44.65 μm
Md: 5 types shown next. With respect to thickness "t", 10% (about 4.47 μm), 14% (about 6.25 μm), 15% (about 6.70 μm), 18% (about 8.04 μm), or 20% (about 8.93 μm).
y (LMB): Made different for each 10 μm within the range not less than 80 μm (Dimensions of Samples Where F=27.12 MHz)
L: 730 μm to 930 μm (for example 830 μm)
W: 570 μm to 770 μm (for example 670 μm)
Lm: 500 μm to 700 μm (for example 600 μm)
Wm: 465 μm to 665 μm (for example 565 μm)
Le: 530 μm to 630 μm (for example 530 μm)
We: 390 μm to 590 μm (for example 490 μm)
t: 1670/27.12=about 61.58 μm
Md: 20% of thickness "t" (about 12.32 μm)
y (LMB): Made different for each 10 μm within a range from 120 μm to 200 μm.

The vibration elements 5 were mounted so that their distances "y" and LMB became equal to each other. The distance "y" and depth Md were made different among the plurality of samples because these two dimensions were considered to be representative of dimensions where fastening the vibration element 5 with respect to the element mount member 3 influences the vibration of the mesa part 15m.

The length L, width W, width Wm, and width We and the shape and area of the pad parts 19a were made the same among the plurality of samples. Accordingly, for example, when the distance "y" was made large, the lengths Lm and Le were made small. Note, at this time, the distance between the center C of the crystal blank 15 and the center Cm of the mesa part 15m was made constant.

CI was measured in a state where the vibration element 5 was not sealed. Note that, if the vibration element 5 is sealed by the element mount member 3 and lid member 7 and is placed under a vacuum atmosphere, the CI becomes further smaller than the current measurement value.

About 30 samples were prepared for one dimension. For example, in the case of F=37.4 MHz, about 30 sample were prepared only as samples having a depth Md of 10% of thickness "t" and 80 μm as distance "y". Further, CI was measured for each sample. The measurement value of CI for each distance "y" and depth Md is the mean value of those approximately 30 samples.

When showing the measurement results, sometimes use will be made of a dimensionless quantity (for example y/t) obtained by dividing the distance "y" by the thickness "t". In the vibration element 5 utilizing thickness-shear oscillation as in the present embodiment, the resonance frequency F and the thickness "t" are basically proportional. Accordingly, by using the dimensionless quantity such as y/t, a characteristic which does not depend on the resonance frequency is easily found.

(Measurement Results Where F=37.4 MHz)

Figures 5A, 5B:
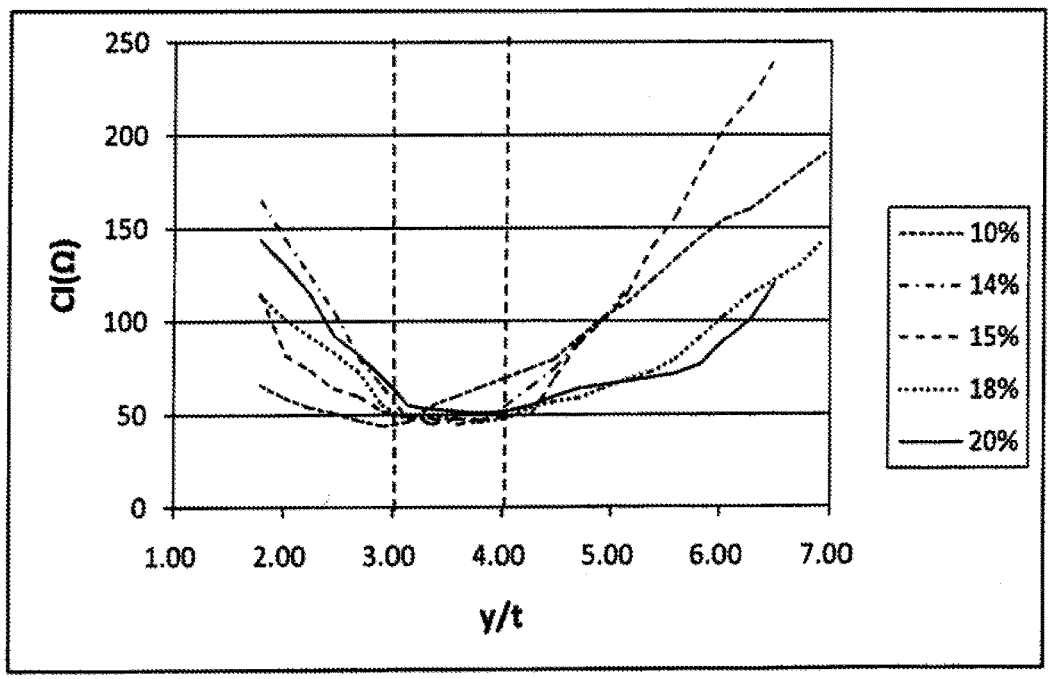
FIG. 5A and FIG. 5B are a chart and graph showing the measurement results of CI in a case where the resonance frequency is 37.4 MHz.

FIG. 5A is a chart showing the measurement results of CI in the case where the resonance frequency F is 37.4 MHz. This chart shows the value of CI (Ω) for each combination of the value of y/t and the value of Md.

Further, FIG. 5B is a graph showing the measurement results shown in FIG. 5A. In this chart, an abscissa shows y/t, and an ordinate shows the CI (Ω). Further, for each value of Md, a line showing the change of CI with respect to the change of y/t is drawn.

As shown in these charts, it will be understood that in each line (any depth Md), there is the tendency that if y/t becomes larger, at first (within a range where y/t is roughly 3.0 or less), the value of CI becomes smaller, then the value of CI becomes larger. That is, it will be understood that the value of y/t need not always be large and may be within a preferred range.

Further, except the case where the depth Md is 10% of the thickness "t", in a period after the value of CI becomes small to when the value of CI becomes large (substantially 3.0<y/t<4.0), there is a range where the value of CI substantially becomes constant. That is, it is seen that a unique range exists.

Within the range where y/t is small (y/t<3.0), the reason the value of CI becomes smaller as y/t becomes larger is considered to be the fact that the vibration in the mesa part 15m is obstructed due to fastening at the pad parts 19a if y/t is small.

Within the range where y/t is large (4.0<y/t), the reason the value of CI becomes larger as the y/t becomes larger is considered to be the fact that the areas of the mesa part 15m and excitation electrodes 17 become small if y/t becomes large.

Further, the reason the value of CI becomes constant when y/t is within a range between the above two ranges (for example 3.0<y/t<4.0) is considered to be that the effect of reduction of the influence of the fastening at the pad parts 19a exerted upon the vibration of the mesa part 15m is not obtained even when y/t is set at a value larger than the predetermined value, while the influence by reduction of the areas of the mesa part 15m and excitation electrodes 17 is small.

Note that, in the case where the depth Md is 10%, the reason the value of CI does not become constant after it falls (or the range where the value becomes constant is narrow) is for example considered to be that, if the depth Md is small, a mass difference between the mesa part 15m and the outer circumferential part 15p is relatively small and the energy enclosing effect is apt to become weak, therefore there is a large influence by the reduction of area of the mesa part 15m.

As shown in FIG. 5B, if the depth Md is different, the value of CI and the ratio of change at the time when the value of CI becomes smaller (range where y/t<3.0) and the time when the value of IC becomes larger (range where 4.0<y/t) are different.

On the other hand, when the value of CI becomes the minimum, from another viewpoint, when the value of CI has become constant (3.0<y/t<4.0), even if the depth Md is different, the values of CI are substantially equal to each other. The fact that when the value of the depth Md becomes large to a certain extent, the value of CI is constant even when the value of Md is made larger than that is shown in Patent Literature 1. The current measurement results showed that the effects were established only within the unique range of y/t where the value of CI became the minimum or a constant value when changing y/t.

Further, the ranges of y/t for making the value of CI minimum or making the value of CI constant from another viewpoint do not depend upon the depth Md but are substantially equal except the case where the depth Md is 10% of the thickness "t". That is, without regard to the magnitude of the depth Md, the value of CI becomes the minimum or constant within the range where 3.0<y/t<4.0. Further, even in the case where the depth Md is 10%, the range where the fall of the value of CI ends is about 3.0 in the same way as the case where the depth Md has another magnitude.

This result that the range of y/t where the CI becomes the minimum or constant is determined without depending upon the magnitude of Md runs counter to the intuitive expectation that if the depth Md becomes small, the influence of fastening of the pad parts 19a exerted upon the vibration of the mesa part 15m would end up becoming large unless y/t is made large. That is, this is knowledge which was obtained first according to the current measurement results.

(Measurement Results Where F=27.12 MHz)

Figures 6A, 6B:
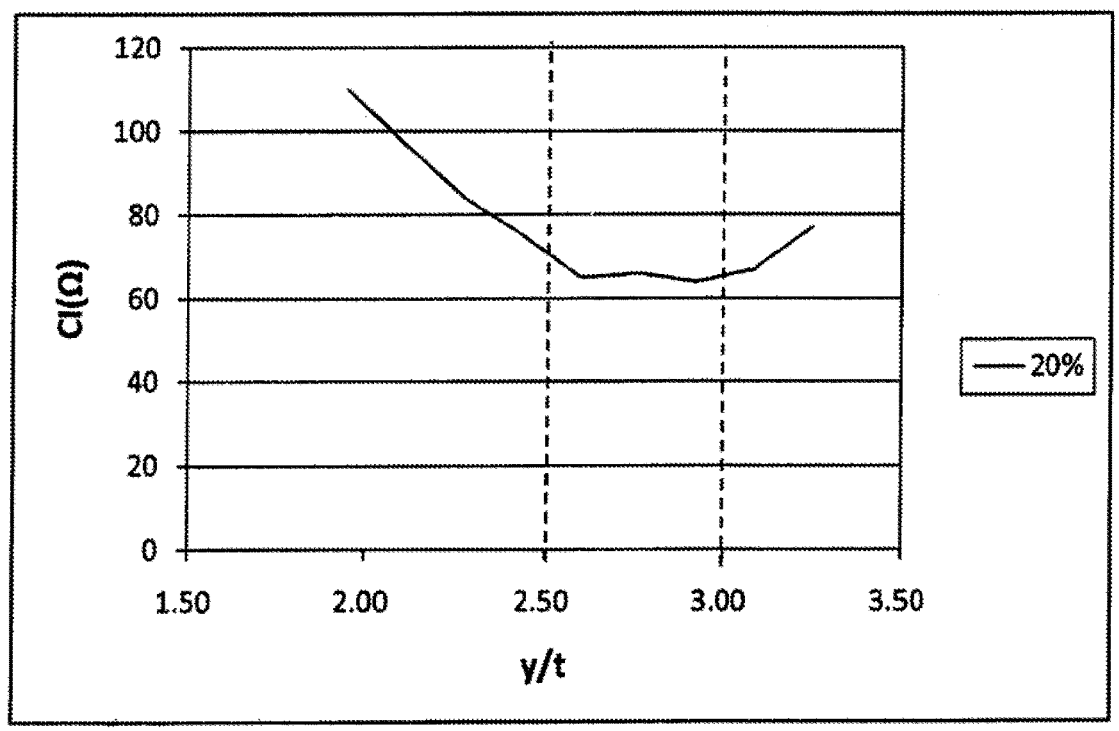
FIG. 6A and FIG. 6B are a chart and graph showing the measurement results of CI in a case where the resonance frequency is 27.12 MHz.

FIG. 6A and FIG. 6B are charts the same as FIG. 5A and FIG. 5B showing the measurement results of CI when the resonance frequency F is 27.12 MHz.

Even in the case where the resonance frequency F is 27.12 MHz, in the same way as the case where the resonance frequency F is 37.4 MHz, when y/t becomes larger, the value of CI becomes smaller first, the value of CI becomes constant next, then the value of CI becomes larger. The unique range where the value of CI becomes the minimum or constant is substantially the range where 2.5<y/t<3.0.

(Preferred Range of y/t)

From the measurement results described above, as the preferred range of y/t (or LMB/t), there can be mentioned the following ranges where the value of CI is sufficiently small and/or the value of CI is constant.

where F=37.4 MHz, $$3.0 < y/t \text{ (or } LMB/t) < 4.0$$

where F=27.12 MHz, $$2.5 < y/t \text{ (or } LMB/t) < 3.0$$

Note that, in the case where the resonance frequency F is 37.4 MHz and the depth Md is 10% of the thickness "t", the value of CI is not constant within the above-described range, but is sufficiently small. For example, in FIG. 5A, CI is 70Ω even if y/t is 4.03. Accordingly, even in the case where the depth Md is 10% of the thickness "t", the above description is a sufficiently preferred range.

y/t is obtained by making the distance "y" dimensionless by the thickness "t" which is proportional to the resonance frequency. Therefore, basically, the same results must be obtained in the case where the resonance frequency F is 27.12 MHz and the case where the resonance frequency F is 37.4 MHz. However the unique range where the value of CI becomes constant is different between the case where the resonance frequency F is 27.12 MHz and the case where the resonance frequency F is 37.4 MHz as described above. Therefore, as described below, a preferred range considering the influence by the resonance frequency is found.

Figure 7:
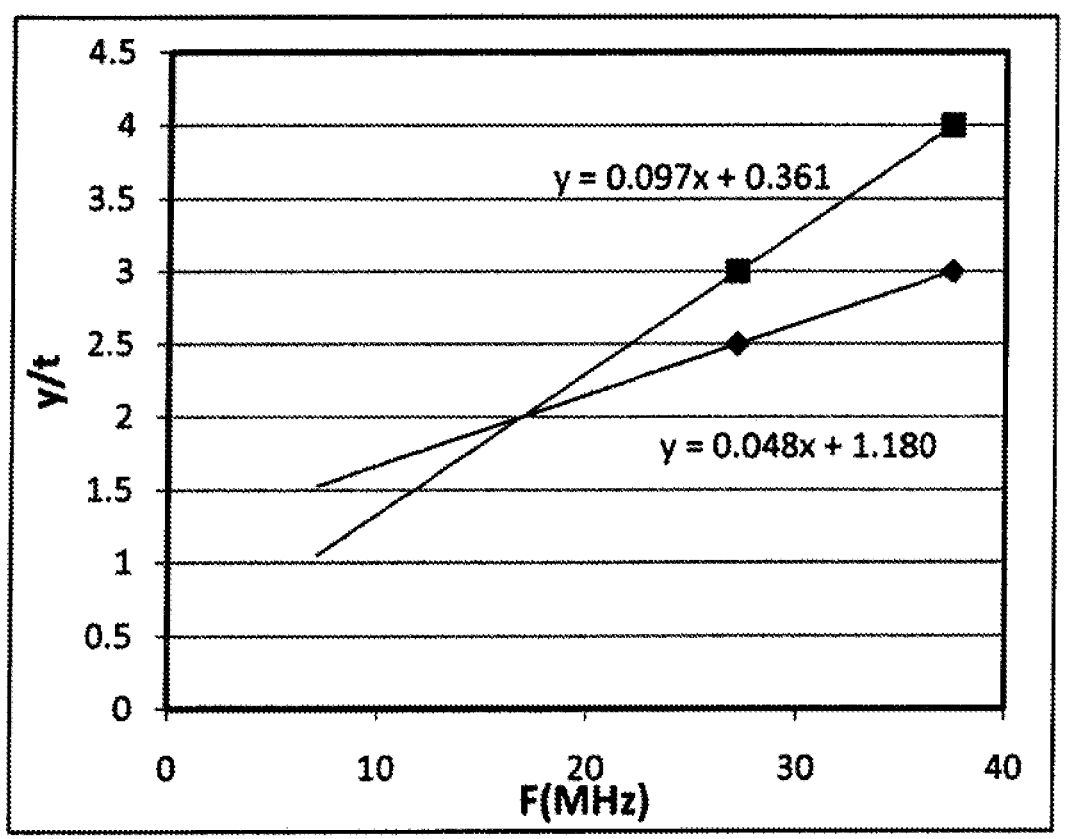
FIG. 7 A chart for explaining a preferred range of y/t (LMB/t).

FIG. 7 is a chart for explaining the preferred range of y/t.

In this chart, the abscissa shows the resonance frequency F (MHz), and the ordinate shows y/t. The plotted four marks indicate the upper limit values or lower limit values of the preferred range of y/t at the time when the resonance frequency F is 37.4 MHz or 27.12 MHz. Further, the two straight lines in the chart are the line connecting the upper limit values to each other and the line connecting the lower limit values to each other. The numerical formulas in the chart are the numerical formulas indicating two straight lines.

Accordingly, the range between the two straight lines can be defined as the preferred range of y/t. That is, the preferred range of y/t is represented by the following formula:

$$0.048F+1.18 < y/t < 0.097F+0.36$$

Note that, naturally, the standing of the above formula is predicated on the standing of the following formula:

$$0.048F+1.18 < 0.097F+0.36$$

From another viewpoint, the straight line indicating the upper limit values and the straight line indicating the lower limit values cross substantially at 16 MHz, and the preferred range described above resides in a range where the resonance frequency is higher than the intersection paint described before.

The above two straight lines indicating the lower limit values and upper limit values are found based on the measurement results concerning two resonance frequencies F. Accordingly, for example, when compared with the lower limit values and upper limit values found based on the measurement results concerning three or more resonance frequencies F, the precision of preferred range described above is low. However, as shown in FIG. 5B and FIG. 6B, these lower limit values and upper limit values define the range of y/t where the CI is the lowest. The CI is sufficiently low even around this range and is for example less than 100Ω. On the other hand, if CI is less than 100Ω, it is sufficiently practical. Accordingly, even the preferred range of y/t which is found based on the measurement results concerning two resonance frequencies F as described above is considered to be sufficiently able to withstand practical use.

(Preferred Range of y/Md)

In the above description, taking note of the unique range where almost no influence of the depth Md appears (for example the range where 3.0<y/t<4.0 when F=37.4 MHz), the preferred range of the distance y (LMD) was found by using y/t which was obtained by making the distance y dimensionless by the thickness t.

However, outside of that unique range, the influence of the depth Md appears. Further, even in the unique range and around that range, when comparing the values of CI in detail, the influence of the value of the depth Md has appeared. Therefore, the preferred range of the distance "y" is found by taking the influence of depth Md into account.

As already explained, within the unique range (for example 3.0<y/t<4.0), even if the depths Md are different, the values of CI are substantially equal (substantially 50Ω). However, when viewed in detail, within this unique range and around this range, the smaller the depth Md, the smaller the y/t where CI becomes the smallest. For example, in the case where the resonance frequency F is 37.4 MHz, the minimum value of CI and y/t corresponding to this minimum value for each magnitude of depth Md becomes as follows.

| Md(%) | CI(Ω) | y/t |
|---|---|---|
| 10 | 44Ω | 2.91 |
| 14 | 47Ω | 3.14 |
| 15 | 45Ω | 3.58 |
| 18 | 46Ω | 3.81 |
| 20 | 51Ω | 3.81 |

Note that, the results described above r counter to the intuitive expectation that when the depth Md becomes small, the influence by the fastening of the pad parts 19a exerted upon the vibration of the mesa part 15m ends up becoming large unless y/t is made large.

When considering the tendency of the change of CI with respect to the depth Md as described above, it may be considered to find the preferred range so that the preferred range of the distance "y" deviates to the larger side as the depth Md is larger. For example, when determining the upper limit value and lower limit value of the preferred range for the value y/Md obtained by making the distance "y" dimensionless by the depth Md, substantially the larger the depth Md, the larger the preferred range of the distance "y".

Figure 8:
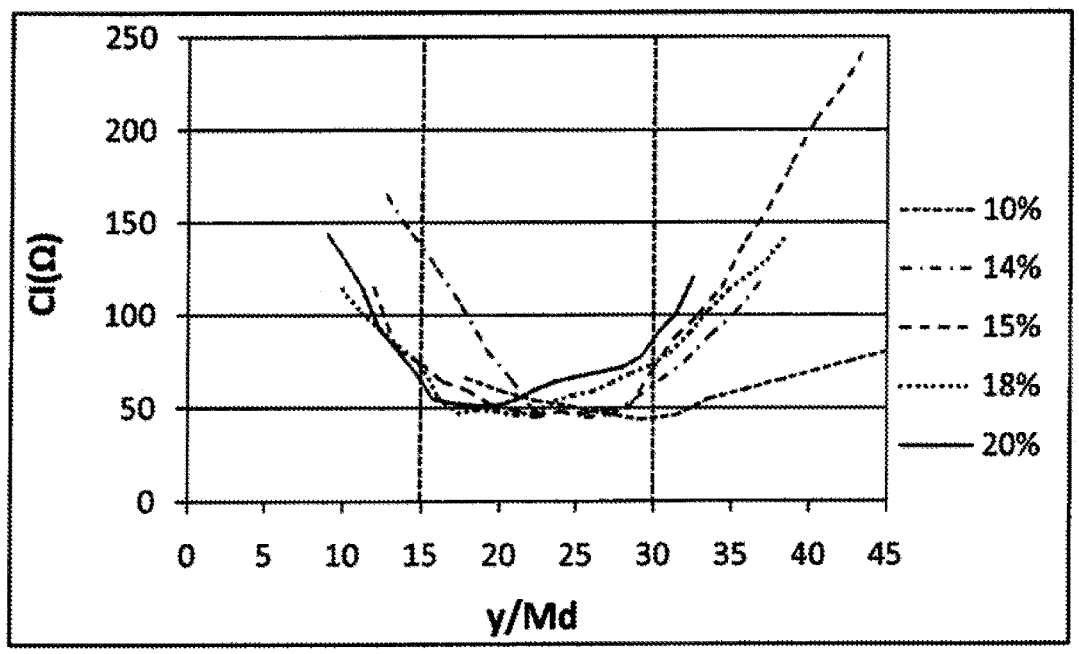
FIG. 8 A chart for explaining a preferred range of y/Md in a case where the resonance frequency is 37.4 MHz.

FIG. 8 is a chart showing the measurement results of CI in the same way as FIG. 5B and in which the abscissa shows y/Md.

When comparing this chart with FIG. 5B, by plotting y/Md on the abscissa, except for a portion (y/Md>30 where MD=10%, and y/Md<23 where Md=14%), it is seen that a plurality of lines (line for each magnitude of Md) overlap well not only within the unique range where the value of CI becomes constant, but also over the entire measurement range. Note that, in the unique range where the value of CI becomes constant, the plurality of lines overlap better in a case where the y/t is plotted on the abscissa.

Accordingly, y/Md is preferred for defining the preferred range constituted by a range broader than the unique range defined by using y/t (for example 3.0<t/y<4.0 where F=37.4 MHz) and where the value of CI becomes a certain extent or less.

Specifically, using y/Md, the following range can be mentioned as the preferred range.
where F=37.4 MHz, $$15<y/Md<30$$

Within the above range, except for the abnormal case (y/Md<23 where MD=14%), the value of CI is less than 100Ω, therefore the vibration element 5 is sufficiently practical.

For the case where F=27.12 MHz, there is no measurement result in which the depth Md is made different. Note, from the difference for the preferred range of y/t between the case where F=27.12 MHz and the case where F=37.4 MHz and from the preferred range of y/Md in the case where F=37.4 MHz described above, the lower limit value and upper limit value of the preferred range of y/Md where F=27.12 MHz can be deduced.

Specifically, by multiplying the ratio of the lower limit value 2.5 of y/t where F=27.12 MHz and the lower limit value 3.0 of y/t where F=37.4 MHz with the lower limit value of y/Md where F=37.4 MHz, the lower limit value 12.5 (15×2.5/3.0) of y/Md where F=27.12 MHz can be obtained. In the same way, by multiplying the ratio of the upper limit value 3.0 of y/t where F=27.12 MHz and the upper limit value 4.0 of y/t where F=37.4 MHz with the upper limit value of y/Md where F=37.4 MHz, the upper limit value 22.2 (30×3.0/4.0) of y/Md where F=27.12 MHz can be obtained.

Accordingly, the preferred range is represented by the following formula:
In the case where F=27.12 MHz, $$12.5<y/Md<22.2$$

The validity of this range will be explained later (FIG. 14).

When generalizing this so that it can be applied to not only the case where F=27.12 MHz, but also various resonance frequencies F, use can be made of a formula for finding the preferred range of y/t in accordance with the resonance frequency F. That is, the preferred range of y/Md in the case of the resonance frequency F (MHz) is represented by the following formula:

$$15\times(0.048F+1.18)/3.0<y/Md<30\times(0.097F+0.36)/4.0$$

(Other Indicator)

In the measurement results obtained this time, when using $y/\sqrt{(Md/t)}$, the range which included the unique range where CI became constant and in which CI was relatively small could be set as the preferred range without regard as to the depth Md and resonance frequency F. For example, in the following range, the value of CI becomes less than 100Ω.

$$3.0<y/(\sqrt{(Md/t)}\times100)<5.5$$

The preferred range of the distance "y" originally should become a more widespread one in the case where it is made dimensionless by the thickness "t" as already explained. In actuality, however, as already explained as well, the preferred range of y/t shifts to the small side by the drop in the resonance frequency F ("t" becomes large). Further, as already explained as well, contrary to the intuitive expectation, the preferred range of y/t shifts to the large side by the increase of the Md. Further, as a result, it is considered that a portion of the influence due to the thickness "t" becomes large and a portion of the influence due to the depth Md becomes large are cancelled by each other, therefore setting of the preferred range by such an indicator becomes possible.

(Comparison of Preferred Ranges)

FIG. 9 to FIG. 14 are charts showing the preferred ranges for each of various resonance frequencies F and depths Md explained above. FIG. 9 to FIG. 13 correspond to the case where F=37.4 MHz, and FIG. 14 corresponds to the case here F=27.12 MHz. Further, FIG. 9 to FIG. 13 correspond to the cases where the depth Md is 20%, 18%, 15%, 14%, and 10% of the thickness "t".

In the charts, in the columns of "CI(Q)", "y/t", "y/Md", and "y/r", these values are shown. Note that, r=√(Md/t)× 100.

In the columns of "CI<100", "3<y/t<4" (or "2.5<y/t<3"), "15<y/Md<30" (or "12.5<y/Md<22.2"), and "3<y/r<5.5", circles are shown when those conditional expressions stand, and while x-marks are shown when they do not stand. That is, the circle marks are shown for the preferred ranges explained above.

In all charts, all preferred ranges are substantially contained within the range where the value of CI becomes less than 100Ω. Further, except FIG. 13 (Md=10%), the preferred ranges of y/t are contained within the preferred range of y/Md. Further, in all charts, the preferred ranges of y/t are contained within the preferred range of y/(√(Md/t)×100).

In FIG. 14 (F=27.12 MHz), the lower limit value and upper limit value of the preferred range of y/Md are derived from the difference for the preferred range of y/t between the case where F=27.12 MHz and the cause where F=37.4 MHz and from the preferred range of y/Md in the case where F=37.4 MHz as already explained. However, the preferred range of y/Md includes the preferred range of y/t. Further, within the range of the distance "y" which is measured this time, the value of CI within the preferred range of y/Md is less than 100Ω. That is, it can be confirmed that the derivation of the preferred range of y/Md in a case other than the case where F=37.4 MHz is valid.

As described above, in the present embodiment, the vibration element 5 has the crystal blank 15, a pair of excitation electrodes 17, and a pair of extraction electrodes 19. The crystal blank 15 is the AT cut crystal blank having the mesa part 15m and the outer circumferential part 15p which is thinner than the mesa part 15m and surrounds the mesa part 15m. The pair of excitation electrodes 17 are provided on the two major surfaces of the mesa part 15m. The pair of extraction electrodes 19 include pad parts 19a which are provided at the end parts of the crystal blank 15 in the longitudinal direction on one major surface of the outer circumferential part 15p and are connected to the pair of excitation electrodes 17.

Further, the length L of the longitudinal direction of the crystal blank 15 is less than 1000 μm, and the resonance frequency F is 37.4 MHz. Further, at the time when "t" is made equal to 1670/F, the distance (μm) between the pad part 19a and the mesa part 15m satisfies:

$3.0<y/t<4.0$

Otherwise, when paying attention to the crystal unit 1, in the crystal unit 1, the vibration element 5 and the element mount member 3 are joined by the bumps 21, and the distance LMB (μm) between the joined range of a bump 21 with respect to the vibration element 5 and the mesa part 15m satisfies:

$3.0<LMB/t<4.0$

Accordingly, as explained with reference to FIG. 5B etc., in the vibration element 5 having a short length L (small size), the value of CI can be made substantially the minimum value. Further, the above-described range specifies the unique range in which the value of CI becomes a constant value in the case where the depth Md becomes 14% or more of the thickness "t". As a result, for example, although the value of CI is minimized, the degree of freedom of design is high. From another viewpoint, the influence of the error in the patterning of the extraction electrodes 19 or the error in joining of the bumps 21 can be reduced.

The case where F=37.4 MHz was explained. In the same way, the degree of freedom of design can be made higher though the value of CI is minimized in the case where the following formula where F=27.12 MHz is satisfied:

$2.5<y/t<3.0$ or $2.5<LMB/t<3.0$

Further, for various resonance frequencies F, the influence by the error in the patterning of the extraction electrodes 19 or the error in the joining of the bumps 21 can be reduced in the case where the following formula is satisfied:

$0.048F+1.18<y/t<0.097F+0.36$ or $0.048F+1.18<LMB/t<0.097F+0.36$

Further, from another viewpoint, in the present embodiment, the length L in the longitudinal direction of the crystal blank 15 is less than 1000 μm, and the resonance frequency F is 37.4 MHz. Further, at the time when "t" is made equal to 1670/F and the depth of the major surface of the outer circumferential part 15p from the major surface of the mesa part 15m is defined as Md (μm), the distance "y" (μm) between a pad part 19a and the mesa part 15m satisfies:

$15<y/Md<30$

Otherwise, when paying attention to the crystal unit 1, in the crystal unit 1, the vibration element 5 and the element mount member 3 are joined by the bumps 21, and the distance LMB (μm) between the joined range of a bump 21 with respect to the vibration element 5 and the mesa part 15m satisfies:

$15<LMB/Md<30$

Accordingly, as explained with reference to FIG. 8, in the vibration element 5 having a short length L (small size), except for abnormal cases, the value of CI can be controlled to less than 100Ω. That is, the vibration element 5 is sufficiently practical. Further, from another viewpoint, a relatively narrow unique range is specified as the preferred range using y/t. However, as the preferred range of y/Md described above, a relatively broad range is specified while suitably evaluating the influence of Md, and the degree of freedom of design is high.

The case where F=37.4 MHz was explained. However, even in the case of the following formula where F=27.12 MHz is satisfied:

$12.5<y/Md<22.2$ or $12.5<LMB/Md<22.2$, in the same way, the degree of freedom of design can be made higher while controlling the value of CI to the minimum value. Further, even in the case where, for various resonance frequencies F, the following formula is satisfied:

$15\times(0.048F+1.18)/3.0<y/Md<30\times(0.097F+0.36)/4.0$ or $15\times(0.048F+1.18)/3.0<LMB/Md<30\times(0.097F+0.36)/4.0$, in the same way, the influence of the error in the patterning of the extraction electrodes 19 or the error in joining the bumps 21 can be reduced.

Further, from another viewpoint, in the present embodiment, the length L in the longitudinal direction of the crystal blank 15 is less than 1000 μm. Further, when the resonance frequency is F(MHz), t=1670/F, and the depth of the major surface of the outer circumferential part 15p from the major surface of the mesa part 15m is Md (μm), the distance "y" (μm) between the pad part 19a and the mesa part 15m satisfies:

$$3.0 < y/(\sqrt{(Md/t)} \times 100) < 5.5$$

Otherwise, when paying attention to the crystal unit 1, in the crystal unit 1, the vibration element 5 and the element mount member 3 are joined by the bumps 21, and the distance LMB (μm) between the joined range of a bump 21 with respect to the vibration element 5 and the mesa part 15m satisfies:

$$3.0 < LMB/(\sqrt{(Md/t)} \times 100) < 5.5$$

Accordingly, as already explained, in the vibration element 5 having a short length L (small size), the value of CI can be controlled to less than 100Ω. That is, the vibration element 5 is sufficiently practical. Further, from another viewpoint, although a relatively narrow unique range is specified as the preferred range using y/t, as the preferred range described above, a relatively broad range is specified while suitably evaluating the influence of Md, and the degree of freedom of design is high. Further, the fit with the preferred range using y/t is higher than the preferred range using y/Md, therefore combined use together with the preferred range using y/t is easy.

The present invention is not limited to the above embodiments and may be executed in various ways.

The crystal vibration device having the crystal vibration element is not limited to a crystal unit. For example, it may be an oscillator having, in addition to a crystal vibration element, an integrated circuit (IC) for generating the oscillation signal by applying voltage to the crystal vibration element as well. Further, for example, the crystal vibration device (crystal unit) may have, other than the crystal vibration element, a thermistor or other electronic element as well. Further, the crystal vibration device may be one equipped with a thermostatic chamber as well. In the crystal vibration device, the structure of the package for packaging the crystal vibration element may be suitably configured. For example, the package may be one having an H-type cross-section so as to have a concave portion in the upper surface and in the lower surface.

The shapes and dimensions of the crystal vibration element are not limited to ones exemplified in the embodiments and may be suitably set. This is because the influence of the fastening of the vibration element upon the vibration of the mesa part largely depends upon the distance "y" (or LMB) and depth Md. For example, the dimensions of the crystal blank in the Z'-axis direction (W and Wm) and the dimensions (Le, We) of the excitation electrode when viewed on a plane are considered not to exert an influence upon the current experiment results so far as they do not greatly deviate from the general dimensions in view of the condition that the length (L) of the crystal blank be less than 1000 μm. Further, the shapes of the outer edge of the crystal blank, outer edge of the mesa part, outer edge of the pad part, and so on are not limited to rectangles and may be ovals or other shapes as well. Note that, "y" or LMB in this case may be for example the shortest distance between the mesa part and a pad part (or bump).

Priority is claimed on Japanese application No. 2016-33838, filed on Feb. 25, 2016, the content of which is incorporated herein by reference.

REFERENCE SIGNS LIST

1 . . . crystal unit (crystal vibration device), 3 . . . element mount member, 5 . . . crystal vibration element, 7 . . . lid member, 15 . . . crystal blank (AT cut crystal blank), 15m . . . mesa part, 15p . . . outer circumferential part, 17 . . . excitation electrode, 19 . . . extraction electrode, and 19a . . . pad part.

The invention claimed is:

1. A crystal vibration element comprising:
an AT cut crystal blank comprising a mesa part and an outer circumferential part which is thinner than the mesa part and surrounds the mesa part,
a pair of excitation electrodes provided on the two major surfaces of the mesa part, and
a pair of extraction electrodes including pad parts provided at the end parts of the crystal blank in the longitudinal direction on one major surface of the outer circumferential part and connected to the pair of excitation electrodes, wherein
the length in the longitudinal direction of the crystal blank is less than 1000 μm the distance "y" (μm) between each of the pad parts and the mesa part satisfies $0.048F+1.18 < y/t < 0.097F+0.36$, here, F (MHz) is the resonance frequency and t is defined by $t=1670/F$.

2. The crystal vibration element according to claim 1, wherein
the resonance frequency F is 37.4 MHz, and
$3.0 < y/t < 4.0$ is satisfied.

3. The crystal vibration element according to claim 1, wherein
the resonance frequency F is 27.12 MHz, and
$2.5 < y/t < 3.0$ is satisfied.

4. A crystal vibration device comprising:
the crystal vibration element according to claim 1,
an element mount member, and
bumps joining the pad parts of the crystal vibration element and the element mount member, wherein
a distance LMB (μm) between the joined range of the bumps with respect to the crystal vibration element and the mesa part satisfies $0.048F+1.18 < LMB/t < 0.097F+0.36$.

5. The crystal vibration device according to claim 4, wherein
the resonance frequency F is 37.4 MHz, and
$3.0 < LMB/t < 4.0$ is satisfied.

6. The crystal vibration device according to claim 4, wherein
the resonance frequency F is 27.12 MHz, and
$2.5 < LMB/t < 3.0$ is satisfied.

7. A crystal vibration element comprising:
an AT cut crystal blank comprising a mesa part and an outer circumferential part which is thinner than the mesa part and surrounds the mesa part,
a pair of excitation electrodes provided on the two major surfaces of the mesa part, and
a pair of extraction electrodes including pad parts provided at the end parts of the crystal blank in the longitudinal direction on one major surface of the outer circumferential part and connected to the pair of excitation electrodes, wherein,
the length in the longitudinal direction of the crystal blank is less than 1000 μm, and
the depth of the major surface of the outer circumferential part from the major surface of the mesa part is Md (μm), the distance "y" (μm) between each of the pad parts and the mesa part satisfies $15 \times (0.048F+1.18)/3.0 < y/Md < 30 \times (0.097F+0.36)/4.0$, here, F (MHz) is the resonance frequency and t is defined by $t=1670/F$.

8. The crystal vibration element according to claim 7, wherein the resonance frequency F is 37.4 MHz, and $15<y/Md<30$ is satisfied.

9. A crystal vibration device comprising:

the crystal vibration element according to claim 7, an element mount member, and bumps joining the pad parts of the crystal vibration element and the element mount member, wherein a distance LMB (μm) between the joined range of the bumps with respect to the crystal vibration element and the mesa part satisfies $15\times(0.048F+1.18)/3.0<LMB/Md<30\times(0.097F+0.36)/4.0$.

10. The crystal vibration device according to claim 9, wherein the resonance frequency F is 37.4 MHz, and, $15<LMB/Md<30$ is satisfied.

11. A crystal vibration element comprising:

an AT cut crystal blank comprising a mesa part and an outer circumferential part which is thinner than the mesa part and surrounds the mesa part, a pair of excitation electrodes provided on the two major surfaces of the mesa part, and a pair of extraction electrodes including pad parts provided at the end parts of the crystal blank in the longitudinal direction on one major surface of the outer circumferential part and connected to the pair of excitation electrodes, wherein, the length in the longitudinal direction of the crystal blank is less than 1000 μm, and the depth of the major surface of the outer circumferential part from the major surface of the mesa part is Md (μm), the distance "y" (μm) between each of the pad parts and the mesa part satisfies $3.0<y/(\sqrt{(Md/t)}\times100)<5.5$, here, F (MHz) is the resonance frequency and t is defined by $t=1670/F$.

* * * * *